US006580271B2

(12) United States Patent
Li et al.

(10) Patent No.: US 6,580,271 B2
(45) Date of Patent: Jun. 17, 2003

(54) MAGNETIC FIELD SENSORS

(75) Inventors: Yi-Qun Li, Orinda, CA (US);
Xiao-Dong Xiang, Alameda, CA (US)

(73) Assignee: Spinix Corporation, Moraga, CA (US)

( * ) Notice: Subject to any disclaimer, the term of this patent is extended or adjusted under 35 U.S.C. 154(b) by 0 days.

(21) Appl. No.: 09/734,813

(22) Filed: Dec. 11, 2000

(65) Prior Publication Data

US 2001/0028245 A1 Oct. 11, 2001

Related U.S. Application Data

(63) Continuation of application No. 09/358,177, filed on Jul. 20, 1999.

(51) Int. Cl.[7] .............................................. G01R 33/00
(52) U.S. Cl. ..................................... 324/260; 324/244
(58) Field of Search ..................... 324/207.13, 207.24, 324/207.25, 260, 262, 244, 209; 73/779, 862.69; 33/361, 355 R, 362, 356; 335/3, 215; 365/157; 310/311, 321, 323.06, 364

(56) References Cited

U.S. PATENT DOCUMENTS

| 3,909,809 A | * | 9/1975 | Kinsner et al. ............... 365/33 |
| 4,004,268 A | * | 1/1977 | Cook .......................... 340/566 |
| 4,499,515 A | * | 2/1985 | Piotrowski et al. ......... 257/252 |
| 4,528,502 A | * | 7/1985 | Rocha ........................ 324/109 |
| 4,769,599 A | * | 9/1988 | Mermelstein .......... 310/323.01 |
| 4,866,384 A | * | 9/1989 | Oetzmann .................... 324/209 |
| 4,975,643 A | * | 12/1990 | Buchwald .................... 318/118 |
| 5,130,654 A | * | 7/1992 | Mermelstein ................ 324/244 |
| 5,675,252 A | * | 10/1997 | Podney ........................ 324/209 |

FOREIGN PATENT DOCUMENTS

GB          2188157       *  9/1987

* cited by examiner

*Primary Examiner*—Jay Patidar
(74) *Attorney, Agent, or Firm*—John F. Schipper (57) ABSTRACT

Methods and systems for estimating a value of a static or time varying magnetic field that is present. In a first embodiment, a layer of a magnetostrictive (MNS) material and a layer of a piezoresistive (PZR) material are combined and exposed to the unknown magnetic field, and a current source and charge-carrying line are connected between two spaced apart locations in the PZR layer. A meter measures a voltage difference or current between the two locations and estimates the value of the magnetic field. In a second embodiment, a layer of a magnetostrictive (MNS) material and a layer of a piezoelectric (PZT) material are combined and exposed to a combination of the unknown magnetic field and a selected time varying magnetic field. A meter measures a voltage change, current change or other electrical variable between two spaced apart locations at two or more selected times and estimates the value of the unknown magnetic field. The layers of MNS, PZR and/or PZT material may be planar or may be selected annular sectors or cylindrical sectors.

20 Claims, 6 Drawing Sheets

MAGNETIC FIELD SENSORS

This application is a Continuation In Part of U.S. Ser. No. 09/358,177, filed Jul. 20, 1999. This invention relates to accurate measurement of static and time varying magnetic field values.

FIELD OF THE INVENTION

BACKGROUND OF THE INVENTION

Several methods for measurement of static and time varying magnetic fields are known, including positioning at least one piezoelectric (PZT) layer and at least one magnetostrictive (MNS) layer, contiguous to each other, and measurement of a voltage signal induced in a PZT layer in response to impression of a magnetic field on an MNS layer. Mermelstein, in U.S. Pat. Nos. 4,769,599 and 5,130,654, and Podney, in U.S. Pat. No. 5,675,252, discuss several such methods. Li and O'Handley, in "An Innovative Passive Solid-State Magnetic Sensor", Sensors, October 2000, pp. 52–54, compare performance of a Faraday effect sensor, a Hall effect sensor and other magnetic field sensors with performance of a passive solid state magnetic field sensor that uses a combined magnetostrictive layer and piezoelectric layer.

When these methods are applied to attempt to measure the value of an unknown magnetic field, the variation of induced voltage signal is often found to be relatively insensitive to the value of the magnetic field that is present. What is needed is a new approach that provides a measured value that is more sensitive to the value $H_u = |H_u|$ of an unknown magnetic field that is present at the sensor. Preferably, the measured value should have a unique value for each value $H_u$ of the magnetic field that is present.

SUMMARY OF THE INVENTION

These needs are met by the invention, which provides several embodiments of sensors for static and for dynamic (time varying) magnetic fields. In a first embodiment, one or more layers of a magnetostrictive (MNS) material with selected orientation is mechanically in contact with one or more layers of a piezoresistive (PZR) material, and a substantially static electrical current flows through the PZR material. Impression of a magnetic field $H_u$ on the MNS layer(s) causes the MNS layer(s) to change, or to attempt to change, a dimension in at least one selected direction (e.g., perpendicular to or parallel to an MNS layer-PZR layer interface) and produces a strain or a stress across an MNS layer-PZR layer interface. This change in strain at the interface causes a change in the resistance to flow of electrical charge within the PZR layer, and this change is resistance is measured by a voltmeter or similar instrument, when a constant current is provided within the PZR layer.

In a second embodiment, one or more layers of a magnetostrictive (MNS) material with selected orientation is mechanically in contact across an interface with one or more layers of a piezoelectric (PZT) material, and a time varying electrical current flows in a coil that surrounds the MNS-PZT structure. The time varying electrical current induces a small, time varying, known magnetic field $\Delta H(t)$ on the MNS layer, in combination with a magnetic field with unknown value $H_u$ impressed on the MNS layer. A time varying combined voltage value $V_u + \Delta V(t)$ is developed in the PZT layer, including a contribution $V_u$ from the unknown magnetic field and a contribution $\Delta V(t)$ from the known magnetic field. The combined voltage value $V_u + \Delta V$ (t) is sampled at two or more selected times. An averaged value of the voltage signal, estimated by $0.5\{V_u+\Delta V(t)\}_{max}+0.5\{V_u+\Delta V(t)\}_{min}$, is proportional to the unknown magnetic field value $H_u$ for the field that is present. In both the first and second embodiments, the unknown magnetic field $H_u$ may be static or may change with time at a rate up to about 1 MHz.

DESCRIPTION OF BEST MODES OF THE INVENTION

Figure 1:
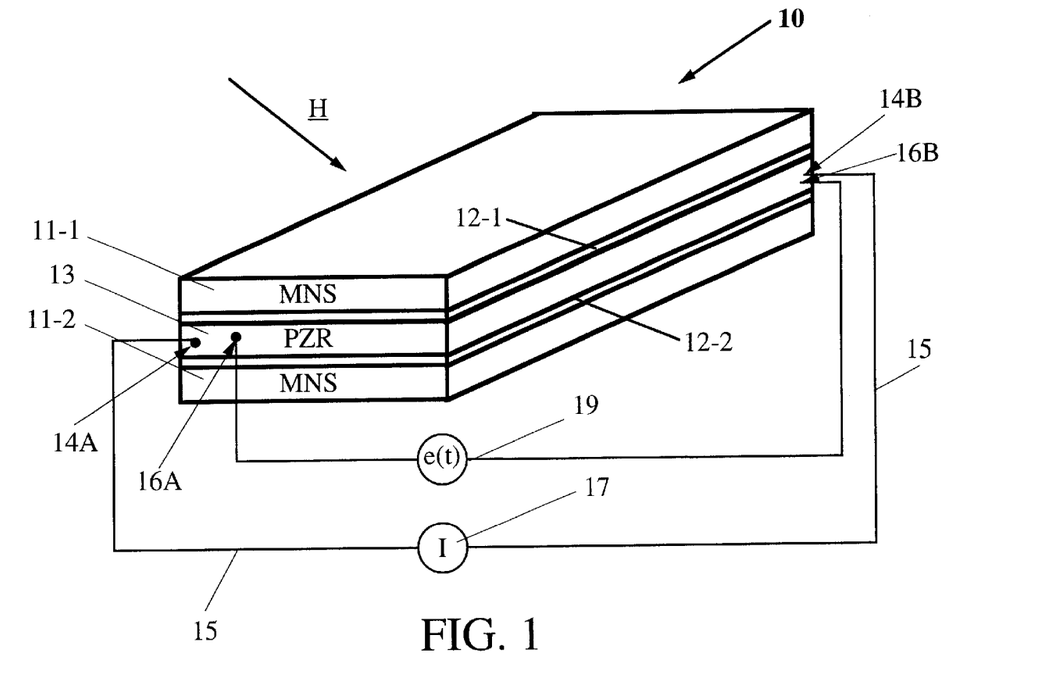
FIGS. 1, 3, 5, 8 and 10 are schematic views of sensors constructed according to first and second embodiments of the invention.
Figure 3:
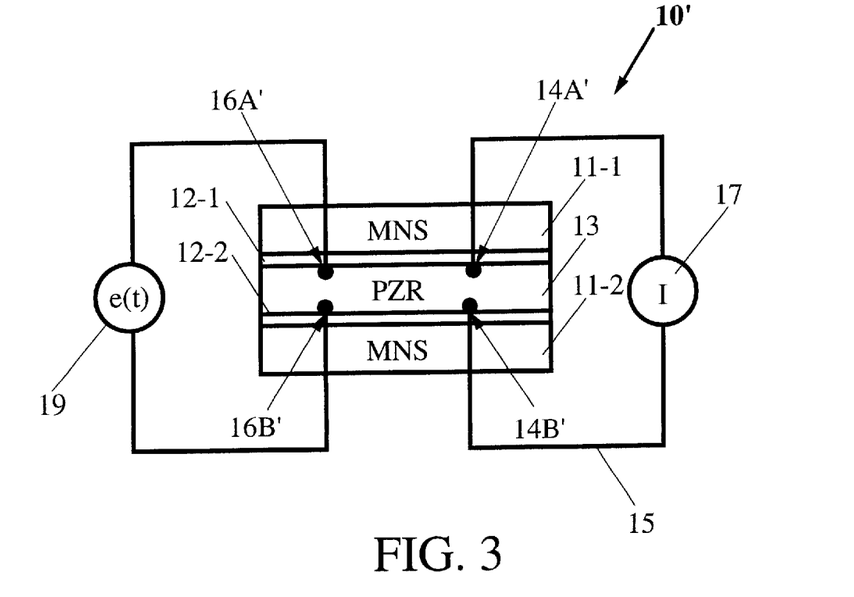

In a first embodiment of a sensor 10, illustrated in FIG. 1, a layer 11-1 of an MNS material is mechanically connected across an interface 12-1 to (or is contiguous to) a layer 13 of PZR material. Optionally, the PZR layer 13 may be positioned between, and be mechanically connected to, two MNS layers, 11-1 and 11-2, as shown in FIG. 1. The interface 12-1 in FIG. 1 is preferably a thin electrically insulating layer or may be a layer of zero thickness (direct contact between MNS layer and PZR layer). A charge-carrying line 15 is connected to the PZR layer 13 at first and second spaced apart locations, 14A and 14B, and a constant current source 17 is positioned on the line 15. A voltmeter or other electrical measurement meter 19 is also positioned to measure a voltage difference or similar electrical measurement value developed between third and fourth locations, 16A and 16B, located adjacent to the first and second locations in response to passage of the current. The current may be oriented parallel to the interface 12-1, as illustrated in FIG. 1, or may be oriented perpendicular to the interface 12-1, as illustrated in FIG. 3.

The MNS layer 11-1 is provided with a selected orientation so that, when the MNS layer 11-1 is exposed to a magnetic field having a magnetic field value $H_u$ (initially unknown), this layer will attempt to expand or contract in a selected direction by an amount $\Delta L(H_u,H_u(ref))$ that depends upon a present value $H_u$ and upon a reference value $H_u(ref)$ of the magnetic field. This difference in length $\Delta L(H_u,H_u(ref))$ in a selected dimension of the MNS layer 11-1 produces a strain across the interface 12-1. This attempt to change length in the MNS layer 11-1 may be partly or wholly resisted by the PZR layer 13 and/or by the interface 12-1, with the result that the interface and the PZR material adjacent to the interface experience a strain and/or an accompanying stress. This induced strain in the PZR layer 13 causes a change $\Delta\rho$ in the resistivity of the PZR layer and will in turn cause a change in the resistance $\Delta R = \Delta R(H_u)$ associated with the path taken by the current through the PZR layer between the third and fourth locations, 16A and 16B. This change in resistance $\Delta R$ will register as a change $\Delta I$ in current passing along the line 15, or as a change $\Delta V$ in a voltage difference between the first and second locations, and the change in current or voltage difference will register as a change in a reading of a ammeter or voltmeter 19. A change of $\Delta I$ in current ($\Delta V$ in voltage) is measured for constant voltage (constant current).

Figure 2:
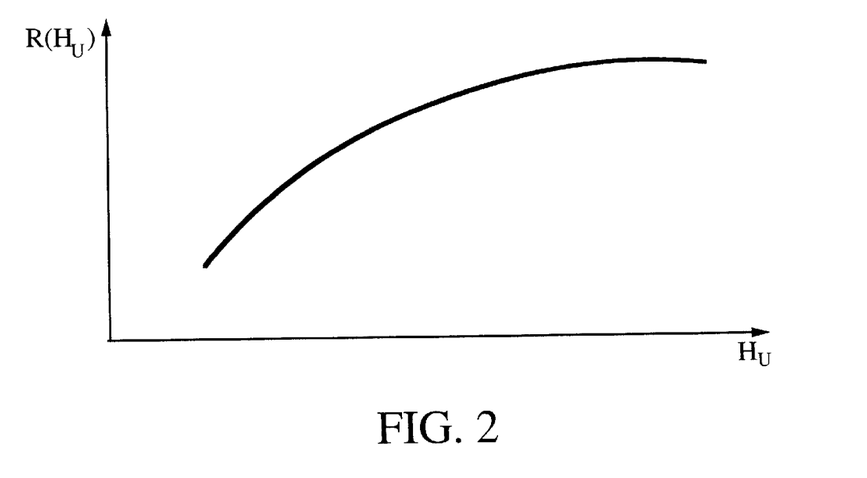
FIGS. 2 and 6 are graphical views illustrating intermediate measurements made to practice the first and second embodiments of the invention.

A magnetic field value $H_u$ (static or time varying) produces a characteristic change in resistance $R(H_u)$, as illustrated in FIG. 2, for the total current path through the PZR layer 13 and along the charge-carrying line 15. A change $\Delta H_u = H_u - H_u(\text{ref})$ in magnetic field value will produce a change $\Delta R$ in total path resistance, which registers as a change in a value measured by a voltmeter or an ammeter placed in the charge-carrying line.

Where the present magnetic field value $H_u(\text{present})=H_u(t)$ is changing with time in FIG. 1, but not too quickly and not by too large an amount, the change in strain in the PZR layer will adjust itself to reflect the changing magnetic field impressed on the MNS layer 11-1, with a time constant $\tau(\text{adjust})$ that is estimated to be of the order of 10 $\mu$sec or less. This change in PZR layer strain will be reflected in a corresponding change $\Delta R = \Delta R(H_u(t))$ in the resistance associated with the current path through the PZR layer 13. An electrical measurement meter 19, with a response time of the order of 10 $\mu$sec or less, will follow this change in magnetic field $H_u(t)$ closely and will measure and record or display the present value of the voltage or current in the line 15.

The embodiment illustrated in FIG. 1 relies upon a current that is oriented parallel to the MNS layer-PZR layer interface. FIG. 3 illustrates another version of the first embodiment, in which the current is oriented perpendicular to the interface, and the associated electrical charge flows transverse to the PZR layer 13, and (optionally) transverse to the MNS layer 11-1, from a first location 16A to a second location 16B on the PZR layer 13, or on the MNS layer(s) 11-1 and 11-2. Here, each interface 12 is preferably a thin electrically conducting layer or a layer of zero thickness (direct contact of MNS layer and PZR layer). Assuming that the current passing adjacent to, or through, the MNS layer 11-1 is small enough that this current does not give rise to a detectable additional magnetic field in the MNS layer, the processing of information for FIG. 3 is the same as the processing for FIG. 1.

Figure 4:
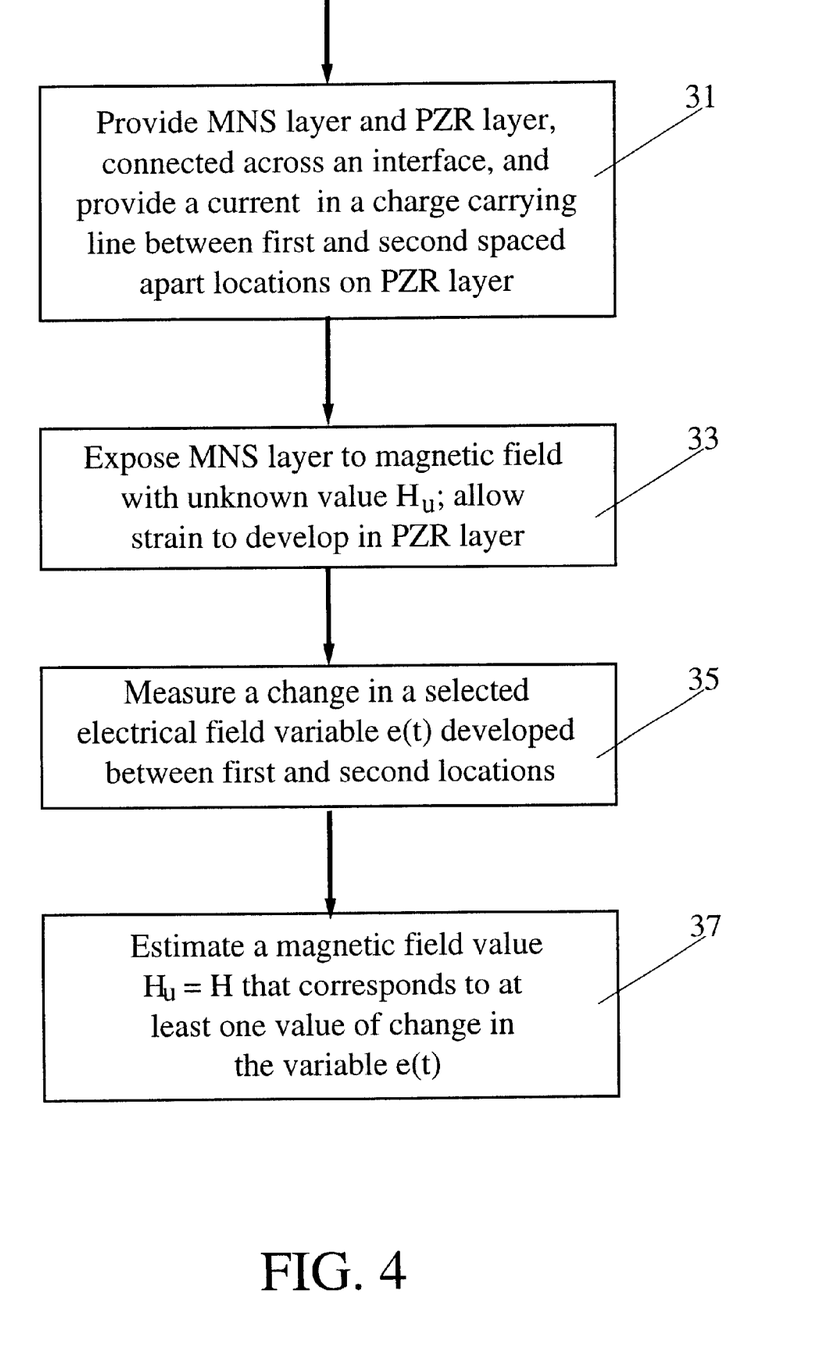
FIGS. 4 and 9 are flow charts of procedures for practicing first and second embodiments of the invention.

FIG. 4 is a flow chart of a procedure for practicing the first embodiment of the invention. In step 31, an MNS layer and a PZR layer are mechanically connected across an interface; and a (constant) current is provided in a charge-carrying line between selected, spaced apart first and second locations on the PZR layer. In step 33, the MNS layer (or a portion thereof) is exposed to a magnetic field with an unknown magnetic field value, and strain is allowed to develop in the PZR layer in response to exposure of the MNS layer to the magnetic field. In step 35, a change in a selected electrical field variable (voltage difference or current) e(t) is measured between the first and second locations for one or more selected times. In step 37, a value of the unknown magnetic field value is estimated that corresponds to the measured change(s) in the variable e(t) at each selected sampling time.

Figure 5:
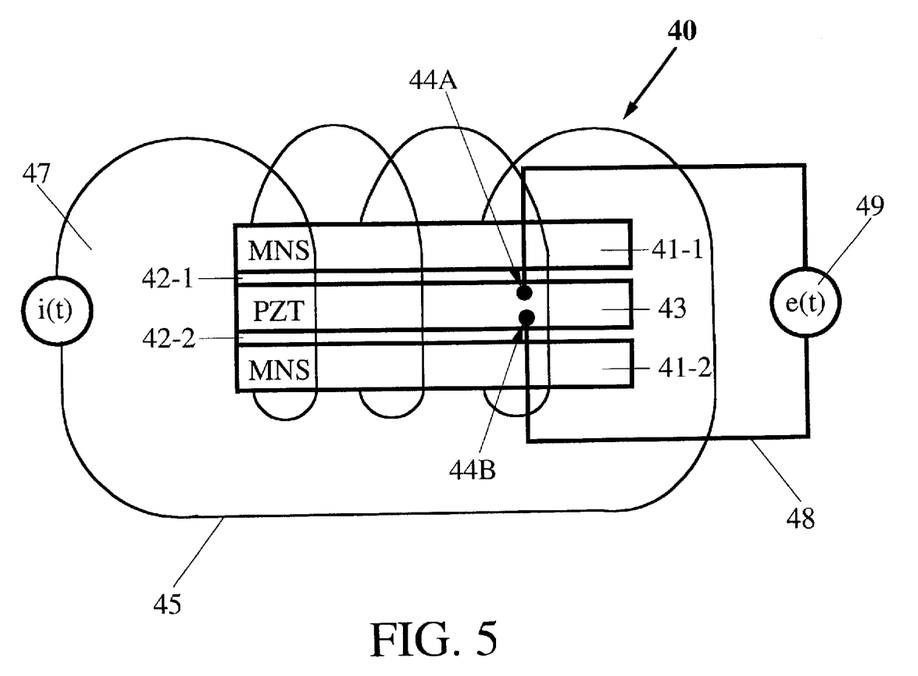

In a second embodiment 40 of the invention, illustrated in FIG. 5, a layer 41-1 of MNS material and a layer 43 of PZT material are mechanically connected across an electrically conducting interface 42-1 (or are contiguous). Optionally, the PZT layer 43 may be positioned between, and be mechanically connected to, two MNS layers, 41-i (i=1, 2), as shown in FIG. 5. A charge-carrying coil 45 with a source 47 of a selected time varying current located therein, or another source of a known time varying magnetic field $$\Delta H(t) = \Delta H_0 \sin\omega_0 t, \quad (1)$$

is positioned adjacent to or wound around the layers 41-1 and 43 (and 41-2, if this layer is included). The MNS layer 41-1 is already exposed to an static or time varying unknown magnetic field $H_u$, which may be time varying, and is additionally exposed to the known time varying magnetic field $\Delta H(t)$. The combined magnetic field, $H_u(t)+\Delta H(t)$, produces (or attempts to produce) a time varying change in dimension in a selected direction in the MNS layer 41-1, which produces a time varying strain at the interface 42-i and in the adjacent PZT layer 43. This time varying strain in the PZT layer 43 produces a time varying voltage difference or other electrical measurement value e(t) in an electrical measurement meter 49 (e.g., a voltmeter) positioned on a line 48 that is connected between spaced apart first and second locations, 44A and 44B, measured in a direction perpendicular to the interface 42-1 in the PZT layer 43. It is assumed that the current passing adjacent to, or through, the MNS layer 41-1 is small enough that this current does not give rise to any additional detectable magnetic field in the MNS layer.

Assume it is known that the unknown magnetic field $H_u$ is (approximately) static. A time varying voltage difference, e(t)=V(t), produced at the meter will be approximately sinusoidal if the time varying coil current i(t) or selected magnetic field is sinusoidal:

$$V(t) \approx V_0 + \Delta V \cdot \sin \omega_0 t, \quad (2)$$

where $\Delta V$ is approximately proportional to the peak-to-peak magnetic field magnitude, $$\Delta V \{|\Delta H(t)|_{max} + |\Delta H(t)|_{min}\}/2, \quad (3)$$

and the value V0 is determined primarily by the unknown magnetic field value $H_u = |H_u|$. At least two values of the voltage signal V(t) are measured, preferably corresponding to maximum and minimum values of this voltage signal. If two or more voltage difference values, V(t1) and V(t2) are measured at times t=t1 and t=t2 with $$\omega_0 \cdot t1 \approx \pi/2 \text{ or } 3\pi/2 \text{ (modulo } 2\pi), \quad (4A)$$

$$\omega_0 \cdot t2 \approx 0 \text{ or } \pi \text{ (modulo } 2\pi), \quad (4B)$$

one can estimate the values $\Delta V$ and $V_0$ in Eq. (1). If two voltage difference values, V(t1') and V(t2'), are measured at times t=t1' and t=t2' satisfying $$\omega_0(t2'-t1') \approx \pi \text{ (modulo } 2\pi), \quad (5)$$

the intermediate voltage V0 can be estimated as $$V_0 = \{V(t1') + V(t2')\}/2, \quad (6)$$

from which the unknown magnetic field value $H_u$ can be estimated.

Figure 6:
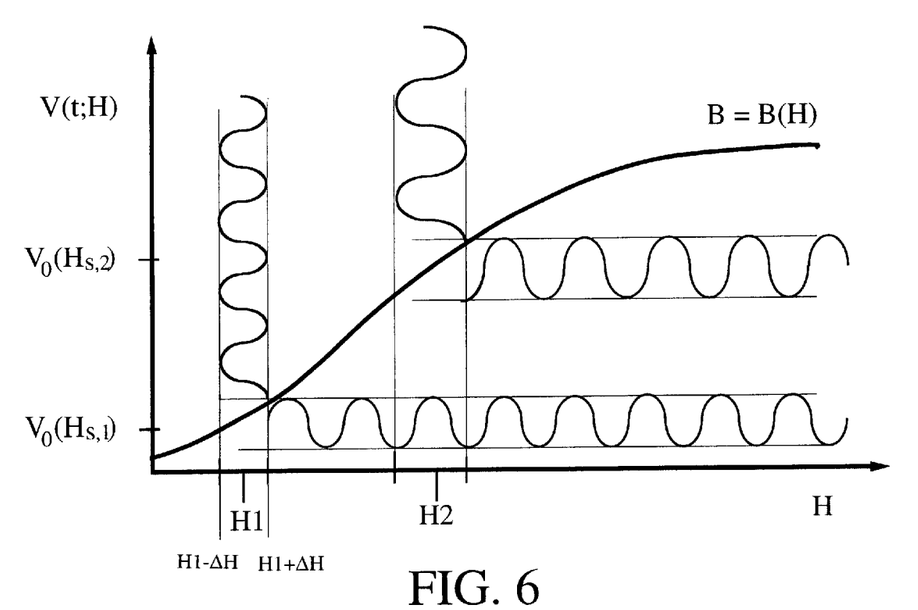

The relationships between voltage increment $\Delta V$ and magnetic field increment $|\Delta H(t)|$, and between the central voltage value $V_0(H_{u,k})$ and the unknown magnetic field value $H_{u,k}$, (k=1, 2), are illustrated in FIG. 6. For each magnetic field value $H_{u,k}$, a corresponding and unique central voltage value $V_0(H_{u,k})$ is measured by the meter 49 in FIG. 5. The relationship between the central voltage value $V_0(H_{u,k})$ and the unknown magnetic field value $H_{u,k}$, may be determined by a magnetization curve, B=B(H), illustrated in FIG. 6, relating the magnetic induction value B to the magnetic field strength value H.

Where the present magnetic field value $H_u(\text{present})=H_u(t)$ is changing with time in FIG. 5, the change in strain in the PZT layer will adjust itself to reflect the changing magnetic field impressed on the MNS layer 41-1, with an associated time constant $\tau(\text{adjust})$ of the order of 1 $\mu$sec or less. This change in PZT layer strain will be reflected in a corresponding change $\Delta V=\Delta V(H_u(t))$ in the voltage difference associated with the first and second locations, 44A and 44B, in the PZT layer 43. A meter 49 with a response time of the order of 1 μsec or less will follow, measure and record or display the present value of the voltage difference or current in the line 45.

Figure 7:
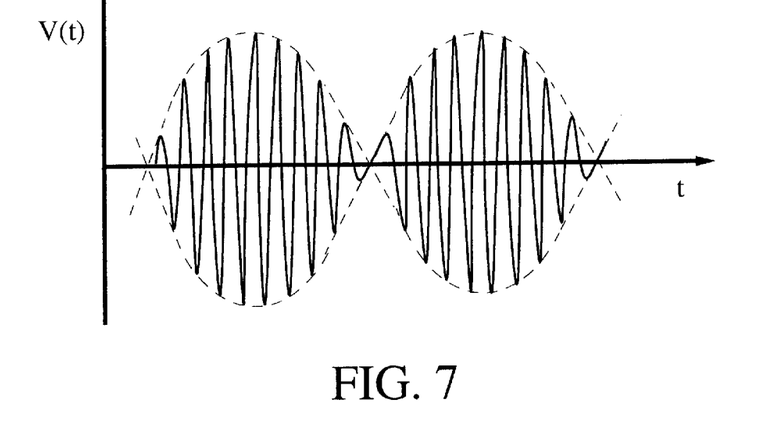
FIG. 7 is a graphical view of a composite signal generated and analyzed in the second embodiment.

Assume that the unknown magnetic field $H_u(t)$ is time dependent and can be represented as a sum of sinusoidal terms with an upper angular frequency $\omega=\omega_k(\max)$, with $\omega_k(\max)$ no greater than about 1 MHz. For purposes of illustration, assume that the unknown magnetic field value can be represented as a sum of a constant term plus a finite sum of K cosinusoidal terms, $$H_u(t) = \sum_{k=1}^{K} H_k \cos\omega_k t, \quad (7)$$

with $K \geq 1$ and $\omega_0$ at least equal to about $2 \cdot \omega_k(\max)$. A weighted sum of sine terms (proportional to $\sin\omega_k t$) can be included in Eq. (7), if desired. The unknown magnetic field $H_u(t)$ and the (known) impressed magnetic field $\Delta H(t)$ are combined through the MNS layer, acting as an intermediary, and produce a total voltage in the PZT layer of approximately $$V(t) = \left\{\sum_{k=1}^{K} V_k \cos\omega_k t\right\} \sin\omega_0 t \quad (8)$$

$$= \sum V_k \{\sin(\omega_0 + \omega_k)t + \sin(\omega_0 - \omega_k)t\}/2$$

in the PZT layer, where the coefficients $V_k$ are approximately proportional to the respective values $H_k$. This is illustrated in FIG. 7. The time varying voltage signal $V(t)$ is demodulated, for example, by multiplication of the voltage signal $V(t)$ by $\sin\omega_0 t$ and by passage of the resulting signal through a low pass filter (LPF) having a reasonably sharp frequency cutoff above $(\omega=\omega_k(\max))$ and below $\omega=\omega_0$. This operation relies upon the relation $$\sin^2\omega_0 t = \{1-\cos(2\omega_0 t)\}/2 \quad (9)$$

to provide a demodulated and low-pass-filtered signal that is proportional to $$V(t; demod) = \sum_{k=1}^{K} V_k \cos\omega_k t. \quad (10)$$

Figure 8:
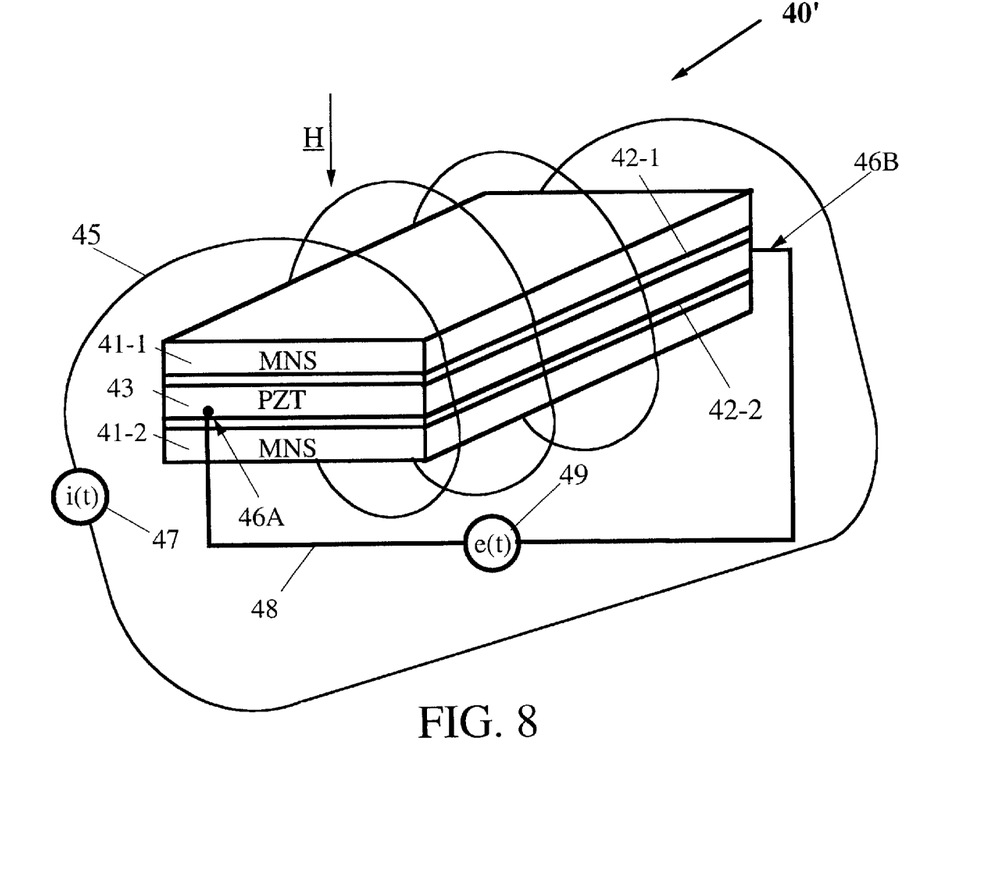

Each component amplitude $V_k$ of the resulting voltage signal V(t;demod) is approximately proportional to the corresponding component amplitude $H_k$ of the original unknown magnetic field $H_u(t)$. Voltage signal demodulation can be performed by the electrical measurement meter 49 (FIGS. 5 and 8).

The embodiment illustrated in FIG. 5 relies upon a current that is oriented perpendicular to the MNS layer-PZR layer interface 42-1. FIG. 8 illustrates another version of the first embodiment, in which the variable e(t) is measured in a direction parallel to the interface, and the associated current is oriented approximately parallel to the interface 42, from a first location 46A to a second spaced apart location 46B on the PZR layer 43. Here, each interface 42-i is preferably a thin electrically insulating layer or a layer of zero thickness (direct contact of MNS layer and PZR layer). The processing of information for the arrangement in FIG. 8 is the same as the processing for the arrangement in FIG. 5.

Figure 9:
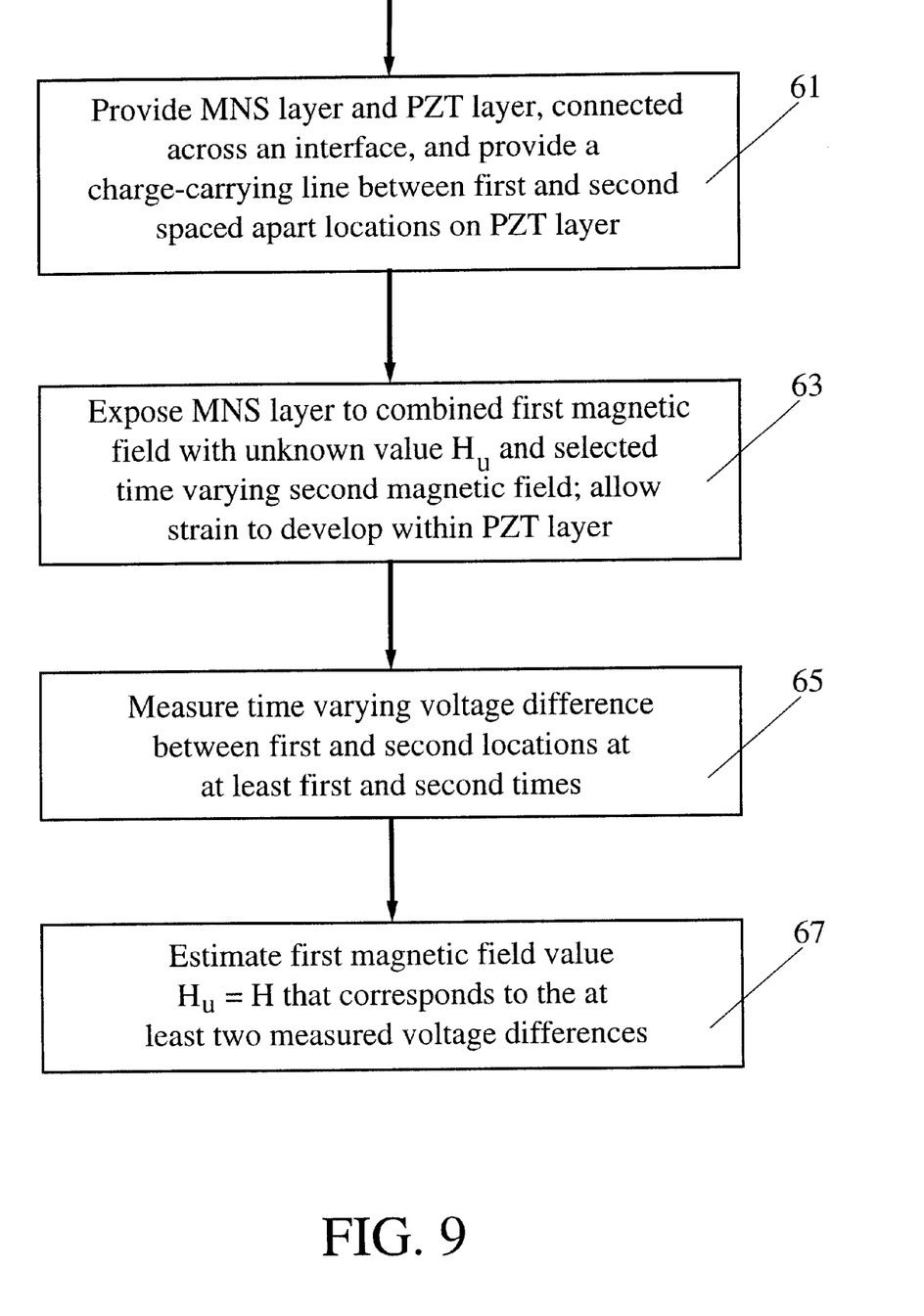

FIG. 9 is a flow chart of a procedure for practicing the second embodiment of the invention. In step 61, an MNS layer and a PZT layer, mechanically connected across an interface, are provided; and a charge-carrying line is provided between selected, spaced apart first and second locations on the PZT layer. In step 63, the MNS layer (or a portion thereof) is exposed to a combined magnetic field, including an unknown first magnetic field and a selected time varying second magnetic field, and strain is allowed to develop in the PZT layer in response to exposure of the MNS layer to the combined first and second magnetic fields. In step 65, a change in a selected electrical field variable (e.g., voltage difference) e(t) is measured between the first and second locations for two or more selected times. In step 67, a value of the unknown magnetic field value is estimated that corresponds to the measured change(s) in the variable e(t) at the two or more selected times.

Suitable MNS materials include: terfenol-D, $Fe_aCo_{1-a}$, Fe, Co, Ni, $Fe_bNi_{1-b}$, $(Tb_cDy_{1-c})Fe_2$ $(0 \leq a,b,c \leq 1)$, $TbFe_2$, $Fe_{0.8}B_{0.2}$, and $Fe_{0.4}Ni_{0.4}B_{0.2}$; ceramics of $Fe_3O_4$, $Fe_2NiO_4$, and $Fe_2CoO_4$; and metallic glasses of FeSiB and (FeNi)SiB. Suitable PZT materials include lead zirconate titanate, polyvinylidene fluoride, aluminum nitride, quartz and $PbTi_x(Mg_{1/3}Nb_{2/3})_{1-x}O_3$ $(0 \leq x \leq 1)$. Suitable PZR materials include semiconductors (e.g., Si, Ge, GaAs and InSb) doped with B, Al, Ga, In, P, As, Sb, combinations of two or more of these dopants, and other suitable dopants. A PZR material may be more sensitive to the present magnetic field value $H_u$ than is a PZT material and may tolerate higher values of electromagnetic interference. However, a PZR material, such as a doped semiconductor, may also be more sensitive to temperature and will require provision of a current supply. The electrical current required with use of a PZR material may be as low as 5–10 milliamps, or lower or higher.

Figure 10:
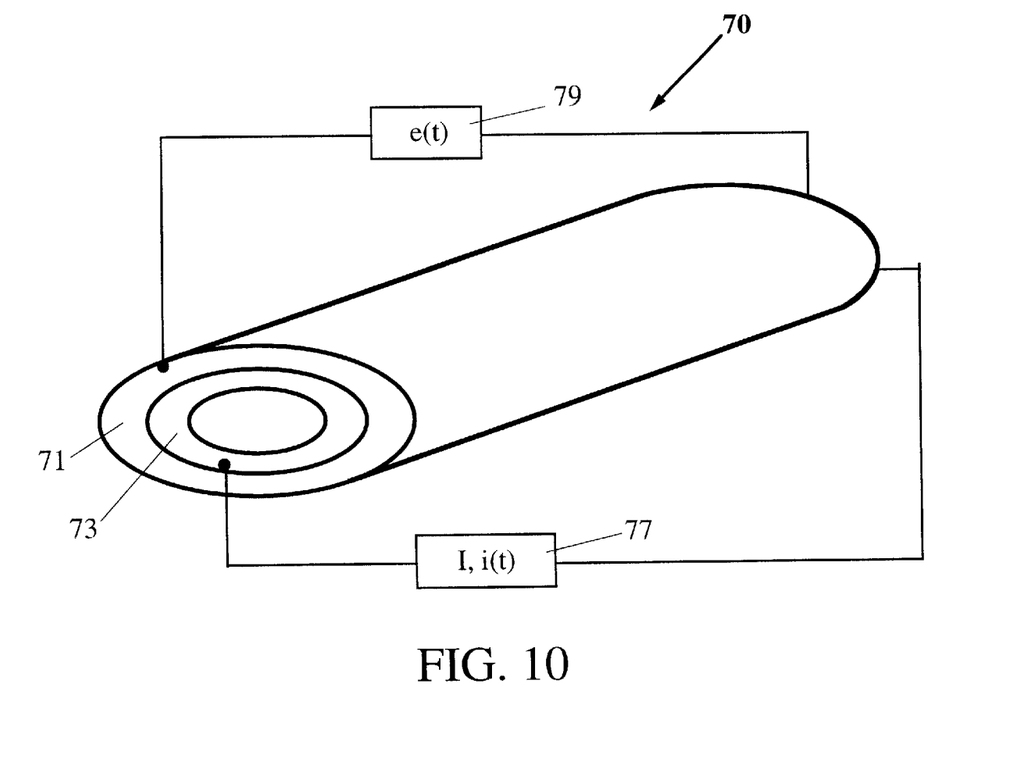

The systems illustrated in FIGS. 1, 3, 5 and 8 use layers of MNS, PZR and/or PZT materials that are, or appear to be, flat or planar. The first and second embodiments can also be implemented using an MNS layer and a PZR layer (or an MNS layer and a PZT layer) that are selected sectors of, including all of, two contiguous annular layers having inner and outer radii of $r_{1,inner}$, $r_{1,outer}$, $r_{2,inner}$ ($\approx r_{1,outer}$) and $r_{2,outer}$, as shown in FIG. 10. The radius $r_{1,inner}$ may be reduced to 0 so that the inner annular layer (MNS, PZR or PZT) becomes a sector of, or all of, a cylinder. As used herein, a "layer" refers to an approximately planar layer, an annular layer (or sector thereof), or a cylinder (or sector thereof) of MNS material, PZR material or PZT material, according to the context. The cylinder or annular layer may have a generally oval cross section, including but not limited to a substantially circular cross section. An electrical variable meter 79 (analogous to 19 in FIGS. 1 and 3, and analogous to 49 in FIGS. 5 and 8) is connected to two spaced apart locations on the PZR or PZT layer 73 (or 71), and a source 77 of steady current (analogous to 17 in FIGS. 1 and 5) or of time varying current (analogous to 47 in FIGS. 5 and 8) is connected to two spaced apart locations on the PZR or PZT layer 73 (or 71). Operation of the system 70 in FIG. 10 is similar to operation of the systems 10, 10', 40 and/or 40' shown in FIGS. 1, 3, 5 and/or 8.

What is claimed is:

1. A method for estimating the value of a magnetic field, the method comprising:
   providing a layer of a selected magnetostrictive (MNS) material, contiguous to a layer of a selected piezoresistive (PZR) material across an MNS-PZR interface;
   providing a current in a charge-carrying line between selected spaced apart first and second locations on the PZR layer;

exposing at least a portion of the MNS layer to a magnetic field, and allowing a change in electrical resistance to develop in the PZR layer in response to exposure of the MNS layer to the magnetic field;

measuring a change in a selected electrical field variable e(t) developed between third and fourth locations adjacent to the first and second locations, respectively, in response to exposure of the MNS layer to the magnetic field; and estimating the magnetic field value that corresponds to at least one value of the change in the variable e(t).

2. The method of claim 1, further comprising choosing said magnetic field to have a substantially constant value.

3. The method of claim 1, further comprising:

allowing said value of said magnetic field to vary with time;

measuring a first value e1 and a second value e2 of said electrical field variable value e(t) at first and second spaced apart selected times, respectively; and estimating an average value of said magnetic field using a linear combination of the measured values e1 and e2.

4. The method of claim 1, further comprising choosing said electrical field variable e(t) from the group of variables consisting of voltage change and current change.

5. The method of claim 1, further comprising choosing said MNS material from the group of materials consisting of: terfenol-D, $Fe_aCo_{1-a}$ ($0 \leq a \leq 1$), Fe, Co, Ni, $Fe_bNi_{1-b}$ ($0 \leq b \leq 1$), $(Tb_cDy_{1-c})Fe_2$ ($0 \leq c \leq 1$)$TbFe_2$, $Fe_{0.8}B_{0.2}$, and $Fe_{0.4}Ni_{0.4}B_{0.2}$; ceramics of $Fe_3O_4$, $Fe_2NiO_4$, and $Fe_2CoO_4$; and metallic glasses of FeSiB and (FeNi) SiB.

6. The method of claim 1, further comprising choosing said PZR material to comprise a selected semiconductor material doped with at least one dopant drawn from the group of dopants consisting of B, Al, Ga, In, P, As and Sb.

7. The method of claim 1, further comprising choosing said first and second locations on said PZR layer so that said current within said PZR layer is oriented substantially parallel to said interface.

8. The method of claim 1, further comprising choosing said first and second locations on said PZR layer so that said current within said PZR layer is oriented substantially perpendicular to said interface.

9. The method of claim 1, further comprising providing at least one of said PZR layer and said MNS layer as at least one of a planar layer and a selected sector of an annulus.

10. A system for estimating the value of a magnetic field, the system comprising:

a layer of a selected magnetostrictive (MNS) material contiguous to a selected piezoresistive (PZR) material, where the MNS layer, when exposed to a magnetic field, provides a change in electrical resistance in the PZR layer;

a charge-carrying line, electrically connected between selected spaced apart first and second locations on the PZR layer, the line having a current source;

a meter that measures a selected electrical measurement variable value e(t) developed between locations adjacent to the first and second locations, in response to exposure of the MNS layer to the magnetic field, and estimates the magnetic field value based on the value of the variable e(t) for at least one measurement time.

11. The method of claim 10, wherein said magnetic field has a substantially constant value.

12. The system of claim 10, wherein said magnetic field is allowed to vary with time and said meter:

measures a first value e1 and a second value e2 of said electrical field variable value e(t) at first and second selected times; and estimates an average value of said magnetic field value using a linear combination of the measured values e1 and e2.

13. The system of claim 10, wherein said electeical field variable e(t) is drawn from the group of variables consisting of voltage change and current change.

14. The method of claim 10, wherein said MNS material is drawn from the group of materials consisting of: terfenol-D, $Fe_aCo_{1-a}$ ($0 \leq a \leq 1$), Fe, Co, Ni, $Fe_bNi_{1-b}$ ($0 \leq b \leq 1$), $(Tb_cDy_{1-c})Fe_2$ ($0 \leq c \leq 1$), $TbFe_2$, $Fe_{0.8}B_{0.2}$, and $Fe_{0.4}Ni_{0.4}B_{0.2}$; ceramics of $Fe_3O_4$, $Fe_2NiO_4$, and $Fe_2CoO_4$; and metallic glasses of FeSiB and (FeNi)SiB.

15. The system of claim 10, wherein said PZR material comprises a selected semiconductor material doped with at least one dopant drawn from the group of dopants consisting of B, Al, Ga, In, P, As and Sb.

16. The system of claim 10, wherein said first and second locations on said PZR layer are chosen so that said current within said PZR layer is oriented substantially parallel to said interface.

17. The system of claim 10, wherein said first and second locations on said PZR layer are chosen so that said current within said PZR layer is oriented substantially perpendicular to said interface.

18. The system of claim 10, wherein at least one of said PZR layer and said MNS layer is provided as at least one of a planar layer and a selected sector of an annular layer.

19. The method of claim 1, further comprising:

providing a second layer of said MNS material, contiguous to said layer of PZR material across a second MNS-PZR interface and positioned so that said PZR layer lies between said first MNS layer and the second MNS layer;

exposing at least a portion of the second MNS layer to said magnetic field, and allowing a resulting change in electrical resistance to develop in said PZR layer in response to exposure of the second MNS layer to said magnetic field;

measuring a further change in said selected electrical field variable e(t) developed between said third and fourth locations, in response to exposure of the second MNS layer to said magnetic field; and estimating a magnetic field value that corresponds to at least one value of the resulting change in said variable e(t).

20. The system of claim 10, further comprising:

a second layer of said MNS material, contiguous to said layer of PZR material across a second MNS-PZR interface and positioned so that said PZR layer lies between said first MNS layer and the second MNS layer, wherein the second MNS layer, when exposed to said magnetic field, provides a second change in electrical resistance in said PZR layer;

wherein said meter measures a further change in said selected electrical field variable e(t) developed between said third and fourth locations, in response to exposure of the second MNS layer to said magnetic field and estimates a magnetic field value that corresponds to at least one value of the resulting change in said variable e(t).

* * * * *